United States Patent [19]
Brown

[11] Patent Number: 5,471,877
[45] Date of Patent: Dec. 5, 1995

[54] ENVIRONMENTAL STRESS SCREENING PROCESS WITH LIQUID COUPLED VIBRATION

[75] Inventor: Edwin Z. Brown, Westminster, Colo.

[73] Assignee: AT&T IPM Corp., Coral Gables, Fla.

[21] Appl. No.: 93,103

[22] Filed: Jul. 16, 1993

[51] Int. Cl.$^6$ .................................................. G01M 7/00
[52] U.S. Cl. .............................................. 73/571; 73/662
[58] Field of Search ............................ 73/662, 664, 571, 73/577

[56] References Cited

U.S. PATENT DOCUMENTS

| | | | |
|---|---|---|---|
| 2,278,241 | 3/1942 | Case | 73/662 |
| 4,733,151 | 3/1988 | Butts | 73/664 |
| 5,039,228 | 8/1991 | Chalmers | 73/662 |
| 5,187,432 | 2/1993 | Bauernfeind et al. | 324/158 |

*Primary Examiner*—Richard Chilcot
*Assistant Examiner*—Max H. Noori

*Attorney, Agent, or Firm*—John C. Moran

[57] ABSTRACT

A testing system for stressing assembled circuit boards well beyond normal operational limits with respect to mechanical vibration, supply voltage cycling, and temperature cycling. The combination of these three elements of stressing results in each of the three elements accelerating the effects of the other two elements. The circuit boards are transferred between a cold bath of inert liquid and a hot bath of inert liquid while power voltages are applied for short periods of time at voltages which exceed the normal voltages of the devices and vibrations are introduced into the inert liquid. The vibrations scan a broad range of frequencies thus accelerating the effect of the hot bath. In particular, in the hot bath, the use of ultrasonic frequency greatly accelerates the speed at which components are induced to absorb heat. The vibrations allow the detection of potential failures in the wire bonding of integrated circuits. The testing system allows for the integration of both vibration, supply voltage, and temperature stressing in one integrated work station allowing the goals of a just-in-time manufacturing process to be achieved.

4 Claims, 3 Drawing Sheets

ENVIRONMENTAL STRESS SCREENING PROCESS WITH LIQUID COUPLED VIBRATION

TECHNICAL FIELD

The present invention relates to environmental screening of electronic circuit boards.

BACKGROUND OF THE INVENTION

A well known problem in the manufacturing of electronic circuit boards is early failures which are referred to as infant failures. Statistically, the majority of the electrical devices that will fail in the first ten years will fail during the first year of operation. To reduce these failures and associated warranty cost, manufacturers perform burn-in tests. Such tests can eliminate the majority of the electrical devices that will fail during the first year of operation. During a burn-in test, the devices are subjected to elevated thermal or electrical operating conditions for a long period of time, typically, one to eight weeks, thereby simulating one year of operation under normal conditions.

In the prior art, U.S. Pat. No. 5,187,432 stresses assembled circuit boards well beyond normal operational limits both with respect to supply voltages and temperature cycling. The circuit boards are transferred between a cold bath of inert liquid and a hot bath of inert liquid while the power voltages are being applied for short periods of time at voltages which may exceed the normal voltages of the devices. The circuit boards are transferred rapidly between the hot bath to the cold bath and vice versa and maximum stresses are achieved without damaging parts or circuit boards.

Whereas the testing method set forth in U.S. Pat. No. 5,187,432 performs the functions of a burn-in test, there still exists a class of flaws which can only be accelerated into observable failures by doing mechanical vibration stressing. Prior art mechanical vibration stressing has consisted of placing equipment on mechanical shaker tables and mechanically moving the whole electrical apparatus. Whereas such vibration testing does perform the mechanical vibration stressing, it is not compatible with high velocity manufacturing and just-in-time (JIT) processes. The JIT process requires that the various parts needed to build a complex piece of electronic gear such as a modern telecommunications system arrive at the manufacturing plant almost simultaneously and that the complete electronic system is produced in a matter of days, often as short as four or five days. Since a large amount of time is required to assemble circuit boards, there is a limit on how many different stages of testing can be performed. Each additional stage introduced into the JIT process adds to the delay in producing the final product. In addition, the JIT process requires that individual components of the electronic system be tested separately. The most complex component in the electronic system is the printed circuit packs. Prior art vibration techniques of testing each circuit pack individually on shaker tables would cause additional delays.

Hence, there exists a long felt need among electronic system manufacturers for a method that combines burn-in and vibration testing in a simple integrated testing method.

SUMMARY OF THE INVENTION

The foregoing problems are solved by a method and apparatus that involve stressing assembled circuit boards well beyond normal operational limits with respect to mechanical vibration, supply voltage cycling, and temperature cycling. The combination of these three elements of stressing results in each of the three elements accelerating the effects of the other two elements. The circuit boards are transferred between a cold bath of inert liquid and a hot bath of inert liquid while power voltages are applied for short periods of time at voltages which exceed the normal voltages of the devices and vibrations are introduced into the inert liquid. The vibrations scan a broad range of frequencies thus accelerating the effect of the hot bath. In particular, in the hot bath, the use of ultrasonic frequency greatly accelerates the speed at which components are induced to absorb heat. Advantageously, the vibrations allow the detection of potential failures in the wire bonding of integrated circuits. Most importantly, this new method and apparatus allows for the integration of both vibration, supply voltage, and temperature stressing in one integrated work station allowing the goals of a JIT process to be achieved.

Other and further aspects of the present invention will become apparent during the course of the following description and by reference to the accompanying drawings.

DETAILED DESCRIPTION

Figure 1:
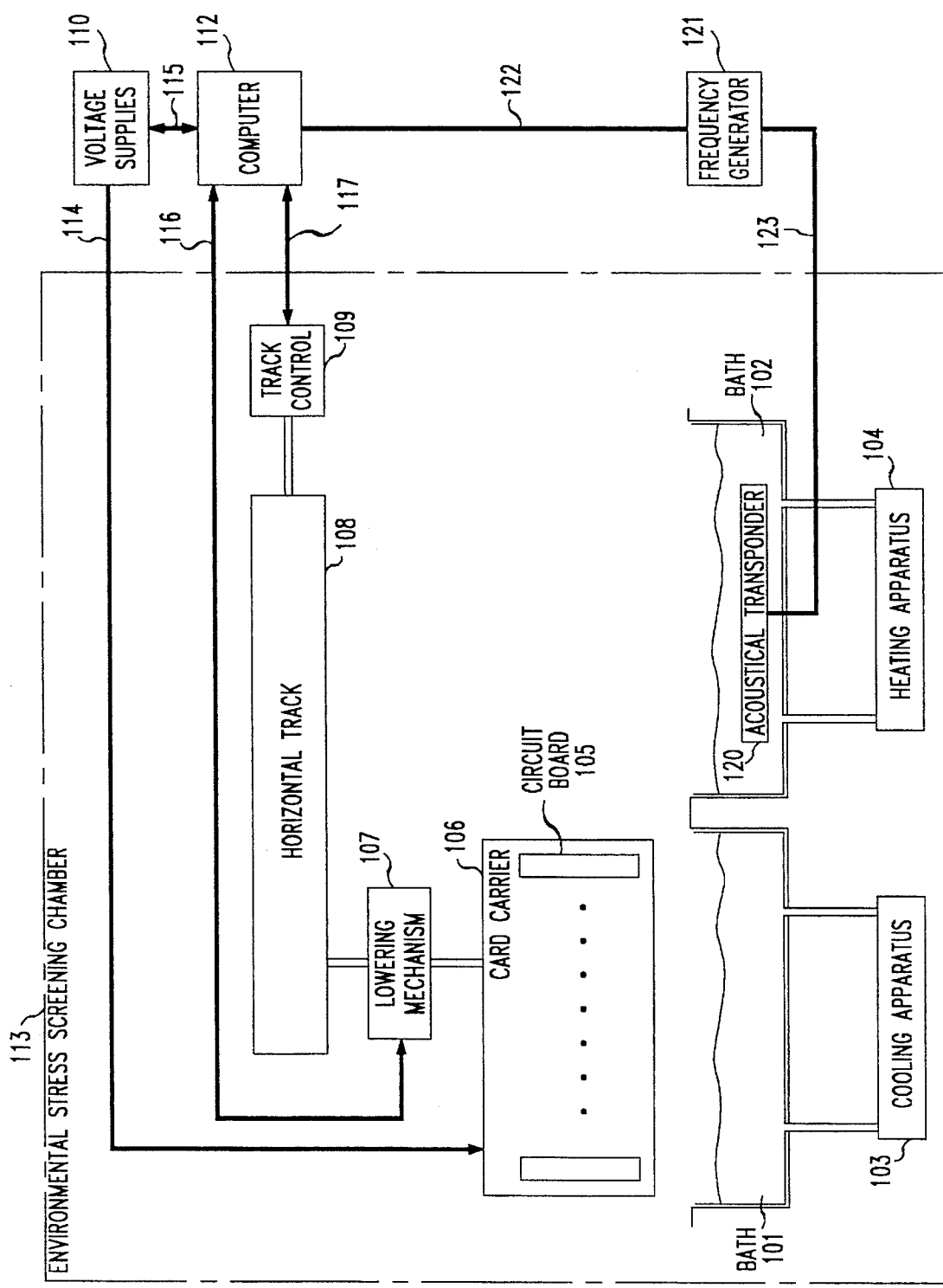
FIG. 1 illustrates, in block diagram, form the environmental screening chamber for practicing the invention.

FIG. 1 illustrates, in block diagram form, environmental stress screening chamber 113 which is controlled by computer 112. Card carrier 106 contains a plurality of circuit boards such as circuit board 105 which are going to be stressed. By controlling frequency generator 121, computer 112 introduces mechanical vibrations into bath 102 by exciting acoustical transducer 120. The mechanical vibrations set up in the inert liquid of bath 102 accelerate mechanical flaws in the circuit boards under test to determine failures. The vibrations introduced are swept from approximately 20 Hz to 100 kHz. The ultrasonic frequency vibrations (20 kHz to 100 kHz) not only induce mechanical failures but also excite molecules within electronic components of the circuit boards so that the thermal and electrical stresses occur faster or are more penetrating. With the faster occurrences of those stresses within the limits of the circuit boards, late or intermittent problems are more apt to become observable defects that can be detected and removed. The ultrasonic frequencies can be varied quickly and easily.

Figure 3:
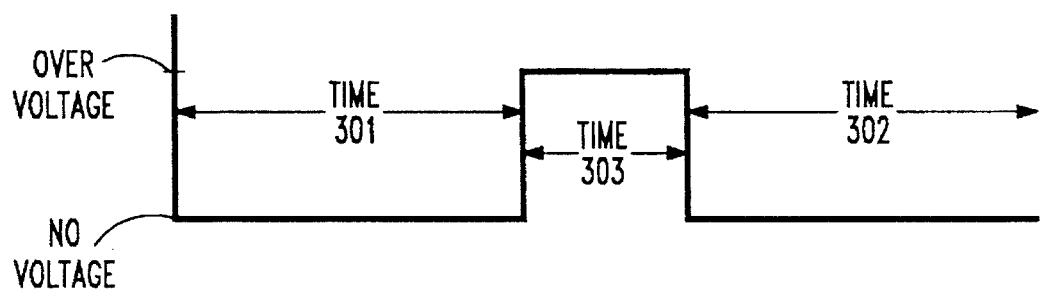
FIGS. 3 and 4 illustrate the manner in which supply voltages are applied to circuit boards during the stress process.

Computer 112 controls the power voltages for the circuit boards in card carrier 106 by controlling voltage supplies 110 which supply voltage to card carrier 106 via cable 114 and vibrations by controlling acoustical transducer 120 via frequency generator 121. The stressing method is to first insert card carrier 106 into bath 101 by actuation of lowering mechanism 107 by computer 112. Bath 101 is referred to as the cold bath and advantageously may be maintained at a temperature ranging from −5° C. to −20° C. After the card carrier 106 is in bath 101 for a predefined amount of time, computer 112 actuates voltage supplies 110 to apply extreme voltages as illustrated in FIG. 3 to the circuit boards within card carrier 106. As illustrated in FIG. 3, no voltages are applied until time 303. During time 301, the circuit boards are allowed to reach the temperature of bath 101. This is done to simulate the "arctic" condition which can occur when power is first applied to a system. After card carder 106 has been in bath 101 for time 303, voltages are removed from card carder 106. After time 302, card carrier 106 is removed from bath 101 by actuation of lowering mechanism 107 and positioned over bath 102 by actuation of horizontal track 108 by track control 109 under control of computer 112. Bath 102 is referred to as the hot bath and advantageously may be maintained at a temperature ranging from 50° C. to 85° C.

Figure 4:
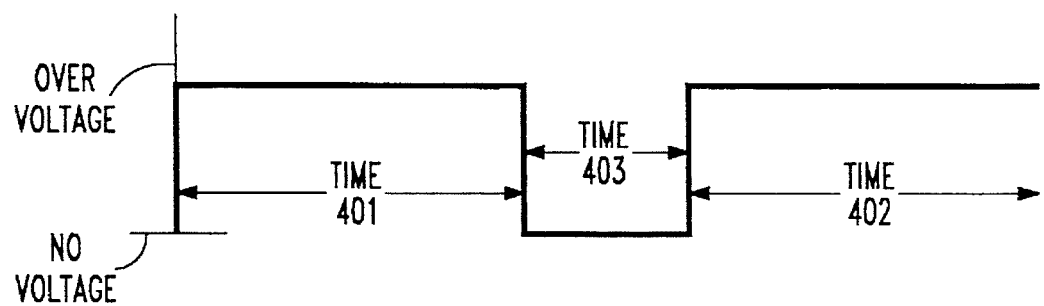

Card carrier 106 is then lowered into bath 102 by actuation of lowering mechanism 107. As soon as card carrier 106 is submerged in bath 102, computer 112 actuates voltage supplies 110 via cable 115 to supply extreme voltages and actuates frequency generator 121 via cable 122 to control acoustical transducer 120 to sweep a range of frequency and vibration intensifies, as illustrated in FIG. 4. After card carrier 106 has been in bath 102 for time 401, voltage supplies 110 are deactivated for time 403. After time 402, acoustical transducer 120 is deactivated and card carrier 106 is removed from bath 102 and repositioned back over bath 101. After this cycle has been performed for the designated number of times, card carder 106 is removed from the environmental stress screening chamber 113 and is replaced by another card carder having a new set of circuit boards to be processed. After being stress tested in environmental stress screening chamber 113, an operational test is performed on each circuit pack in card carder 106 to determine if each circuit pack is still fully operational.

Environmental stress screening chamber 113 is illustrated only in block diagram form and does not show the mechanism for recovering the inert liquids in bath 101 and 102 which will be released into the interior of the screening chamber.

Figure 2:
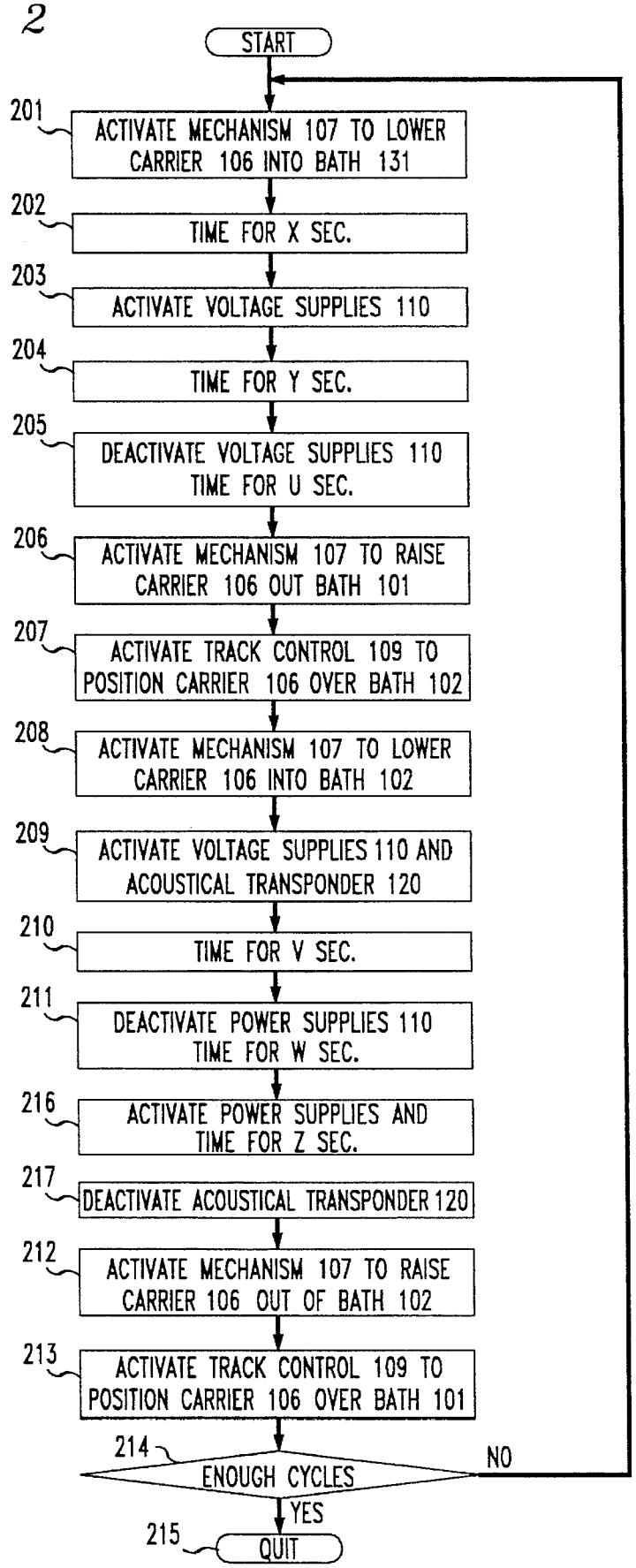
FIG. 2 illustrates, in flow chart form, a program to control the environmental testing chamber.

FIG. 2 illustrates, in flowchart form, a program for controlling computer 112. At the start of each cycle, block 201 is executed to activate lowering mechanism 107 so that carrier 106 is placed into bath 101. Block 202 then times for X seconds which advantageously may be 30 seconds (time 301 of FIG. 3). After this time has elapsed, block 203 is executed to actuate voltage supplies 110 to increase the nominal 5 volts supply up to 7.5 volts and the other voltages are increased up to 10% above their nominal value. This amount of voltage increase is far in excess of the normal operating margins allowed on the power voltages.

After block 204 has timed for Y seconds (time 303 of FIG. 3) which may be 5 seconds, block 205 is executed to deactivate voltage supplies 110. After U seconds (time 302 of FIG. 3) has elapsed, block 206 actuates mechanism 107 to raise card carder 106 out of bath 101, and block 207 is actuated so that track control 109 repositions card carder 106 over bath 102. U may be 25 seconds.

Block 208 is then executed to lower card carder 106 into bath 102. As soon as card carrier 106 is submerged in bath 102, block 209 is activated to supply the high voltages to the circuit boards in card carrier 106 and to generate vibrations by acoustical transducer 120. Block 210 then times for V seconds (time 401 of FIG. 4) which may be 30 seconds. At the end of this time period, block 211 is executed to deactivate voltage supplies 106 and time for W seconds (time 403 of FIG. 4) which may be 5 seconds. After V seconds, block 216 activates voltage supplies 110 to supply over voltage for Z seconds (time 402 of FIG. 4) which may be 30 seconds. After Z seconds, voltage supplies 110 are deactivated, block 216 is executed to deactivate acoustical transducer 120, and block 212 is executed to raise the card carrier 106 from bath 102. Finally, block 213 is executed to activate track control 109 to position card carder 106 over bath 103. Decision block 214 is executed to determine if enough cycles have been performed. If enough cycles have been performed, block 215 is executed to quit the stress process on this particular card carder, and the operator is given time to remove the card carrier from the environmental stress screening chamber 113 and to replace this card carrier with a new card carder. If enough cycles have not been performed, then block 201 is executed to commence the execution of the stress screening test on card carrier 106. The number of cycles may be 9. Testing has shown that the time required to transfer card carder 106 from bath 101 to bath 102 should be less than 18 seconds.

Acoustical transducer 120 is illustrated as a single unit; however, in order to generate vibrations in the frequency range from 20 Hz to 100 kHz acoustical transducer 120 could be two separate transducer units. The first transducer unit which would sweep in the low frequencies advantageously would be a transducer unit similar to Model 1411 that is manufactured by Advance Sonic Processing, Inc. The transducer for the ultrasonic range advantageously would be a Prosonic unit manufactured by Ney, Inc. or a Model 750 manufactured by UFI, Inc. The lower frequency starts at 20 Hz with a power density of 4 to 5 watts per square inch. Similarly, the upper frequency starts at 20 kHz with the power level being 4 to 5 watts. In addition, whereas acoustical transducer 120 is illustrated at the bottom of bath 102, the acoustical transducer could be located anywhere in bath 102.

It is to be understood that the above-described embodiment is merely illustrative of the principles of this invention; other arrangements may be devised by those skilled in the art without departing from the spirit and scope of the invention. In particular, one skilled in the art could readily envision using an acoustical transducer in bath 101 to induce vibrations into the circuit boards under test at the cold temperatures. Further, other vibration frequencies and intensities could be utilized. Similarly, different voltage ranges may be used for the voltage power supplies. Also, the number of cycles may be varied.

I claim:

1. An environmental stress testing system for stress testing circuit boards mounted in a carder, comprising:

a hot inert liquid bath that is maintained at a temperature of in excess of 50° C.;

a cold inert liquid bath that is maintained at a temperature of less than –0° C.;

a controller for controlling the environmental stress testing system;

apparatus for transferring the carder between the cold inert liquid bath and the hot inert liquid bath under control of the controller;

power supplies for applying maximum power voltages to the circuit boards in the carrier under control of the controller;

an acoustical transducer system for applying mechanical vibrations to the circuit boards via the hot inert liquid bath and the acoustical transducer system comprises a first and second acoustical transducers with the first acoustical transducer producing low frequency mechanical vibrations in response to the electrical frequency signals with the resulting mechanical vibrations in a range of 20 Hz to 20 kHz and the second acoustical transducer producing high frequency mechanical vibrations in response to the electrical frequency signals with the resulting mechanical vibrations in a range of 20 kHz to 100 kHz so that not only are mechanical failures induced but also molecules within electronic components are excited incurring faster, and more penetrating thermal and electrical stresses; and a frequency generator for applying electrical frequency signals to the acoustical transducer system to control the mechanical vibrations produced by the acoustical transducer system with the frequency generator being controlled by the controller.

2. The environmental stress testing system of claim 1 wherein the first and second acoustical transducers apply mechanical vibrations of 4 to 5 watts per square inch.

3. A method for screening electronic circuit boards mounted in a carrier to detect potential infant failures, the method comprises the steps of:

(A) immersing the carder in a cold bath of an inert liquid that is maintained at a temperature of less than −0° C.;

(B) applying power supply voltages to the electronic circuit boards in excess of the maximum operational voltages upon a first predefined period of time elapsing;

(C) removing the power supply voltages from the electronic circuit boards;

(D) transferring the carder from the cold bath to a hot bath of the inert liquid that is maintained at a temperature of in excess of 50° C. within a second predefined period of time;

(E) applying the power supply voltages to the electronic circuit boards in excess of the maximum operational voltages as the carder is immersed in the hot bath;

(F) applying mechanical vibrations via the inert liquid to the electronic circuit boards with a first range of mechanical vibrations being in the range of 20 Hz to 20 kHz and a second range of mechanical vibrations being the range of 20 kHz to 100 kHz so that not only are mechanical failures induced but also molecules within electronic Components are excited incurring faster and more penetrating thermal and electrical stresses;

(G) removing the power supply voltages and mechanical vibrations from the electronic circuit boards; and (H) repeating steps A through G for predefined number of cycles.

4. The method of claim 3 wherein mechanical vibrations applied have power range of 4 to 5 watts per square inch.

* * * * *